US008319940B2

(12) United States Patent
Butler et al.

(10) Patent No.: US 8,319,940 B2

(45) Date of Patent: Nov. 27, 2012

(54) POSITION MEASUREMENT SYSTEM AND LITHOGRAPHIC APPARATUS

(75) Inventors: Hans Butler, Best (NL); Engelbertus Antonius Fransiscus Van Der Pasch, Oirschot (NL)

(73) Assignee: ASML Netherlands B.V., Veldhoven (NL)

( * ) Notice: Subject to any disclaimer, the term of this patent is extended or adjusted under 35 U.S.C. 154(b) by 1063 days.

(21) Appl. No.: 12/255,328

(22) Filed: Oct. 21, 2008

(65) Prior Publication Data

US 2009/0115987 A1 May 7, 2009

Related U.S. Application Data

(60) Provisional application No. 60/996,106, filed on Nov. 1, 2007.

(51) Int. Cl.

| | |
|---|---|
| ***G03B 27/42*** | (2006.01) |
| ***G03B 27/58*** | (2006.01) |
| ***G03B 27/62*** | (2006.01) |
| ***G01B 11/00*** | (2006.01) |

(52) U.S. Cl. ............... 355/53; 355/72; 355/75; 356/401

(58) Field of Classification Search .................... 355/52, 355/53, 75, 72; 356/399, 400, 401

See application file for complete search history.

(56) References Cited

U.S. PATENT DOCUMENTS

| | | | | |
|---|---|---|---|---|
| 4,786,166 | A | 11/1988 | Kroko | |
| 6,153,886 | A | 11/2000 | Hagiwara et al. | |
| 6,297,876 | B1 * | 10/2001 | Bornebroek | 355/67 |
| 6,768,539 | B2 * | 7/2004 | Gui et al. | 355/53 |
| 7,319,526 | B2 | 1/2008 | Takahashi | |
| 2002/0041377 | A1 | 4/2002 | Hagiwara et al. | |
| 2006/0250597 | A1 * | 11/2006 | Nakajima | 355/55 |
| 2006/0292463 | A1 | 12/2006 | Best et al. | |
| 2007/0288121 | A1 * | 12/2007 | Shibazaki | 700/213 |

FOREIGN PATENT DOCUMENTS

| | | | |
|---|---|---|---|
| JP | 63-307730 | | 12/1988 |
| JP | 01-269002 | | 10/1989 |
| JP | 02-184704 | | 7/1990 |
| JP | 02-231526 | | 9/1990 |
| JP | 04-208551 | | 7/1992 |
| JP | 6260389 | A | 6/1994 |
| JP | 2000299276 | A | 10/2000 |
| JP | 2002014005 | A | 1/2002 |
| JP | 2002038536 | A | 2/2002 |

(Continued)

OTHER PUBLICATIONS

Office Action in related Japanese application No. 2008-273658 mailed Feb. 24, 2011.

(Continued)

*Primary Examiner* — Peter B Kim

(74) *Attorney, Agent, or Firm* — Pillsbury Winthrop Shaw Pittman LLP

(57) ABSTRACT

A measurement system includes a sensor arranged to co-operate with a first pattern arranged on a structure of the measurement system to determine a first position quantity of the sensor relative to the structure, and arranged to co-operate with a second pattern arranged on the structure to determine a second position quantity of the sensor relative to the structure, wherein the first and second patterns are arranged on different surfaces of the structure.

22 Claims, 5 Drawing Sheets

FOREIGN PATENT DOCUMENTS

| | | | |
|---|---|---|---|
| JP | 2002372407 | A | 12/2002 |
| JP | 2004-198252 | | 7/2004 |
| JP | 2005-147828 | | 6/2005 |
| JP | 2006216925 | A | 8/2006 |
| JP | 2007013192 | A | 1/2007 |
| JP | 2007-178281 | | 7/2007 |

OTHER PUBLICATIONS

Office Action in related Japanese application No. 2008-273658 mailed Oct. 4, 2010.

* cited by examiner

POSITION MEASUREMENT SYSTEM AND LITHOGRAPHIC APPARATUS

CROSS REFERENCE TO RELATED APPLICATIONS

The present patent application claims priority under 35 U.S.C. §119(e) to U.S. Provisional Application Ser. No. 60/996,106, filed on Nov. 1, 2007, titled "Position Measurement System And Lithographic Apparatus", the content of which is incorporated herein in its entirety by reference.

FIELD

The present invention relates to a position measurement system and a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In order to project the pattern of the patterning device on the appropriate position on the substrate, accurate knowledge of the instantaneous position of the patterning device and the substrate is desired. In order to obtain this information, the lithographic apparatus is provided with one or more position measurement systems. The most commonly used position measurement systems include interferometer based measurement systems and encoder based measurement systems. The latter generally includes a sensor arranged to co-operate with a grating or pattern enabling the relative position of the sensor and the grating to be determined. In general, such an encoder based measurement system may be used for determining the position of a stage apparatus in a lithographic apparatus. In principle, such an encoder based measurement system provides information regarding a relative displacement of the sensor relative to the pattern when the sensor is moved from one position to an other. As an example, the pattern may be a periodic pattern of lines arranged adjacent to each other along the displacement direction, during the displacement, the sensor counts the number of lines that have passed (note that the individual lines of the pattern, in general, will extend in a direction substantially perpendicular to the displacement direction). Such encoder based measurement systems have been expanded to provide additional information regarding the position of the sensor relative to the grating. Examples are the use of a two-dimensional grating (e.g. including a checkerboard pattern) to provide positional information in two dimensions. Other configurations of the basic encoder measurement system as described above may include a second pattern in order to enable an absolute position measurement. As an example, the pattern may include a reference mark at some position, detection of this mark by the sensor enables a reference position to be set by the sensor.

In case two positional quantities are measured, the grating design tends to become complex, e.g. a checkerboard pattern rather than a pattern of lines, or the inclusion of a reference mark at a specific position within a pattern of lines. In the latter case, the accuracy of the linear grating may be affected by the introduction of e.g. a reference mark. As such, the manufacturing of the grating or pattern may be difficult.

SUMMARY

It is desirable to provide a measurement system of which the grating or pattern is easier to manufacture.

According to an aspect of the present invention, there is provided a measurement system for measuring a position of an object including a sensor arranged to co-operate with a first pattern to determine a first position quantity of the object and with a second pattern to determine a second position quantity of the object, wherein the first pattern and the second pattern are mounted on different surfaces of a structure.

According to an other aspect of the invention, there is provided a lithographic apparatus including an illumination system configured to condition a radiation beam; a support constructed to support a patterning device, the patterning device being capable of imparting the radiation beam with a pattern in its cross-section to form a patterned radiation beam; a substrate table constructed to hold a substrate; and a projection system configured to project the patterned radiation beam onto a target portion of the substrate, the apparatus further includes a measurement system for measuring a position of the support and/or the substrate table, the measurement system including a sensor arranged to co-operate with a first pattern arranged on a structure of the measurement system for determining a first position quantity of the support and/or the substrate table and with a second pattern arranged on the structure for determining a second position quantity of the support and/or the substrate table, wherein the first pattern and the second pattern are mounted on different surfaces of the structure.

In embodiments of the present invention, a position quantity may represent, for example, an absolute position reference, a distance traveled, a displacement between two positions, . . . etc.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
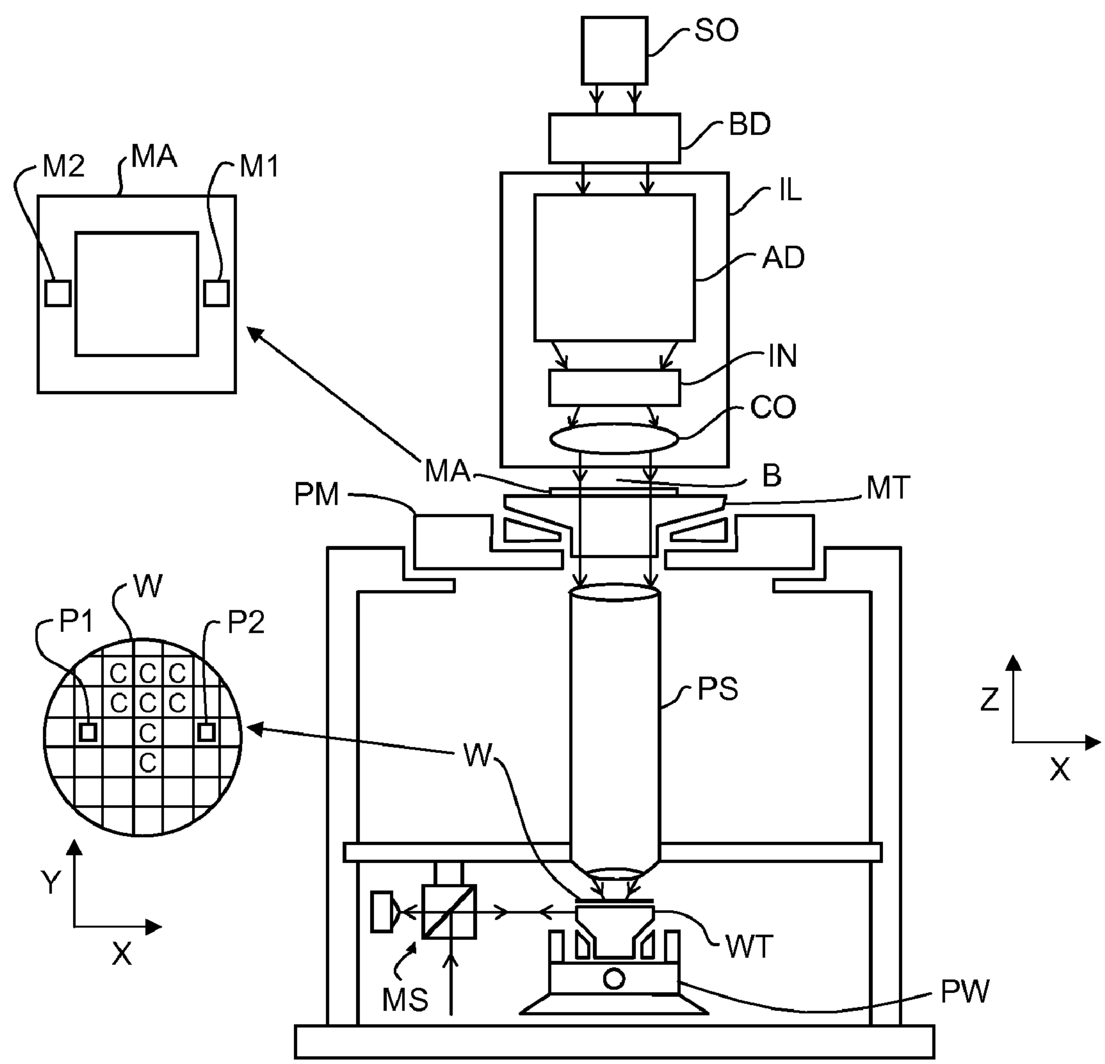
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or EUV radiation); a patterning device support (e.g. a mask table) MT constructed to support a patterning device (e.g. a mask) MA and connected to a first positioner PM configured to accurately position the patterning device in accordance with certain parameters; a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms “reticle” or “mask” herein may be considered synonymous with the more general term “patterning device.”

The term “patterning device” used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term “projection system” used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term “projection lens” herein may be considered as synonymous with the more general term “projection system”.

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such “multiple stage” machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term “immersion” as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the patterning device support (e.g., mask table) MT, and is patterned by the patterning device. Having traversed the patterning device (e.g. mask) MA, the radiation beam B passes through the projection system PS, which focuses the beam onto a target portion C of the substrate W. With the aid of the second positioner PW and position sensor MS (e.g. an interferometric device, linear or planar (2D) encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device (e.g. mask) MA with respect to the path of the radiation beam B, e.g. after mechanical retrieval from a mask library, or during a scan.

In an embodiment of the present invention, either the position sensor MS and/or the position sensor arranged to measure the position of the patterning device (e.g. mask) MA includes a measurement system configured to measure a position of an object (i.e. the mask MA or the substrate W) including a sensor arranged to co-operate with a first pattern to determine a first position quantity of the object and with a second pattern to determine a second position quantity of the object, wherein the first pattern and the second pattern are mounted on different surfaces of a structure. Such a measurement system provides the benefit that the structure including the patterns is easier to manufacture compared to pattern structures (or gratings) of conventional measurement systems. In general, movement of the patterning device support (e.g. mask table) MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the patterning device support (e.g. mask table) MT may be connected to a short-stroke actuator only, or may be fixed. Patterning device (e.g. mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g. mask) MA, the mask alignment marks may be located between the dies.

The depicted apparatus could be used in at least one of the following modes:

1. In step mode, the patterning device support (e.g. mask table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the patterning device support (e.g. mask table) MT and the substrate table WT are scanned synchronously while a pattern imparted to the radiation beam is projected onto a target portion C (i.e. a single dynamic exposure). The velocity and direction of the substrate table WT relative to the patterning device support (e.g. mask table) MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the patterning device support (e.g. mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
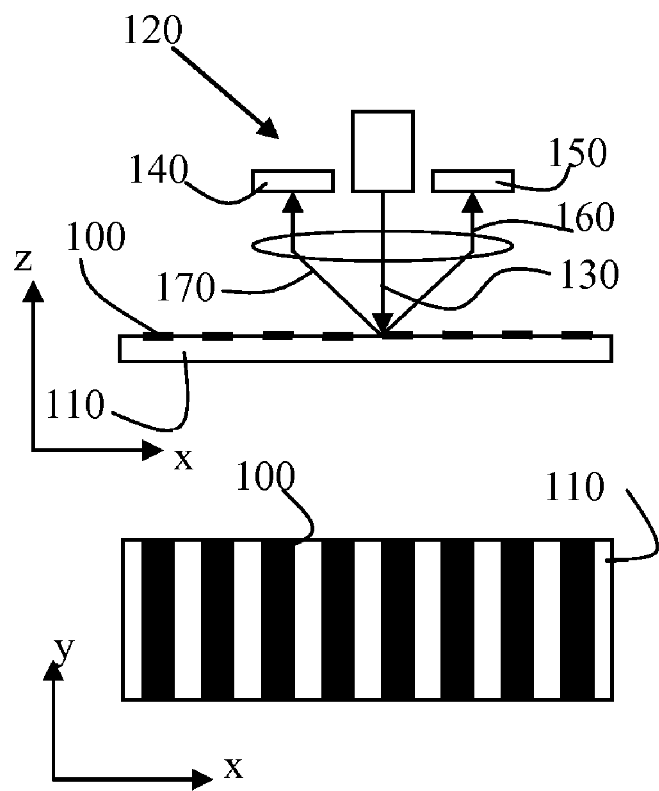
FIG. 2 depicts a measurements system including a sensor co-operating with a pattern as known in the art.

FIG. 2 schematically depicts a XZ-view of a position measurement system as known in the art together with an XY-view of the grating of the measurement system. The system includes a grating 100 on a structure 110 and a sensor 120 arranged the to assess or determine a position quantity of the sensor relative to the grating, in the arrangement as shown, an X-position of the sensor relative to the grating. In the arrangement as shown, the sensor is arranged to project a radiation beam 130 onto the grating 100 and includes, in the example as shown, two detectors 140, 150 for receiving the reflected beams 160, 170 of the grating. Reflected beams 160, 170 may e.g. be the +1 and −1 order (or wave-form) of the reflected beam. In the arrangement as shown, the measurement system constitutes an incremental measurement system, i.e. it may not provide information on the absolute position of either the sensor or the grating.

Figure 3:
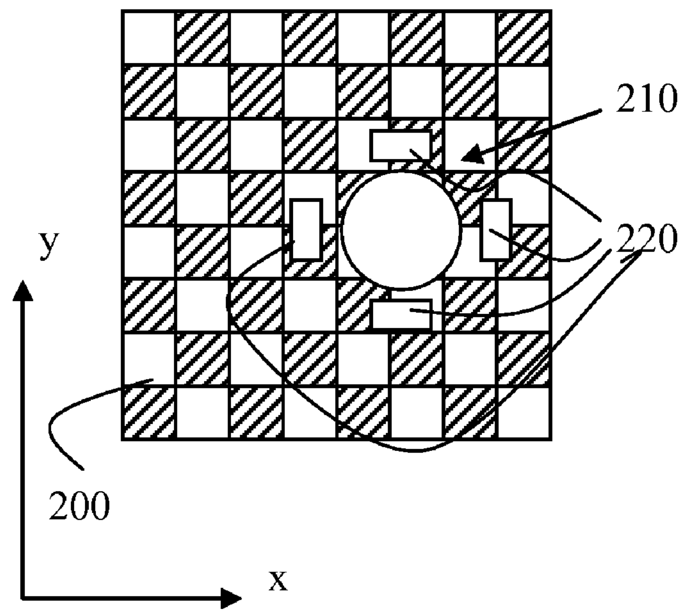
FIG. 3 depicts a second measurement system including a sensor co-operating with a pattern as known in the art FIG. 4 schematically depicts a structure as can be applied in a measurement system according to an embodiment of the present invention.

FIG. 3 schematically depicts a second position measurement system as known in the art. The figure shows a 2D pattern (or grating) 200 provided on a structure (not shown), comparable to a checker board pattern. The arrangement as shown enables the position measurement of the sensor 210 relative to the grating 200 in both X-direction and Y-direction. This may be achieved by detecting a reflected beam (not shown) originating from the sensor 210 towards the detector elements 220 of the sensor 210. As will be appreciated by the skilled person, the manufacturing of the checker board pattern may be more complicated than the manufacturing of a linear grating as e.g. shown in FIG. 2 (XY-view of grating 100). In order to benefit from both the possibility of obtaining two different position quantities, while maintaining the manufacturability of the linear grating, it is proposed to provide two patterns co-operating with a sensor on different surfaces of a structure.

Figure 4:
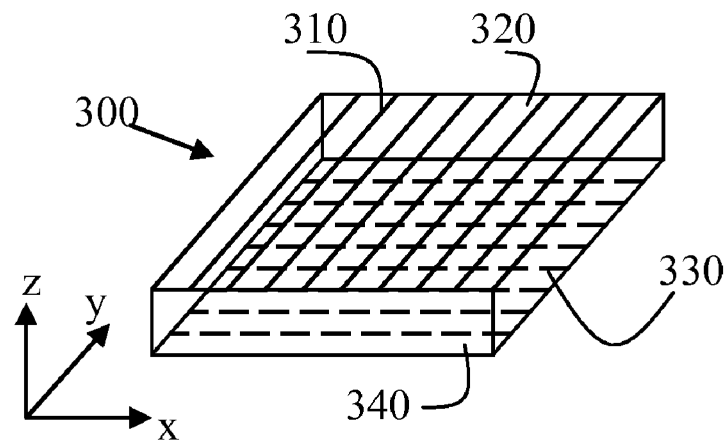

FIG. 4 schematically depicts an example of such a structure in accordance with an embodiment of the invention. The structure 300 as shown includes a first pattern 310 on a first surface 320 of the structure and a second pattern 330 on a second, different surface 340 of the structure. The first pattern 310 may e.g. be a grating including of a plurality of lines, the grating (pattern) extending in a first direction (X-direction), the second pattern 330 may e.g. be a similar grating but extending in a second direction (Y-direction). Note that the individual lines of the gratings actually extend in a direction perpendicular to the direction of the grating, i.e. the individual lines of the grating 310 actually extend in the Y-direction, whereas the grating as a whole extends in the X-direction. It should however be noted that in general, that the first pattern may not extend in a direction that is perpendicular to the direction in which the second pattern extends. In addition, it may be noted that it is not required that the surfaces on which the patterns are mounted are parallel to each other.

Figure 5:
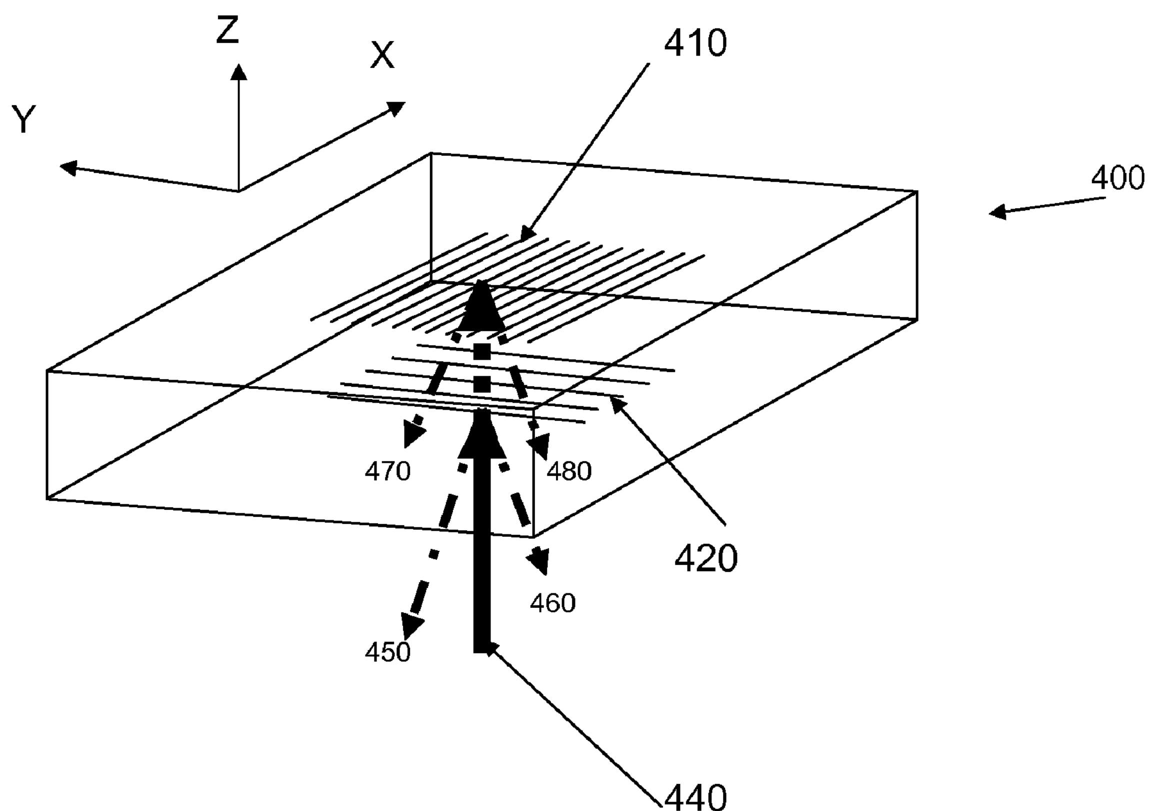
FIG. 5 schematically depicts a 3D view of a position measurement system according to an embodiment of the present invention.

The structure as shown in FIG. 4 may be applied in an embodiment of the present invention as shown in FIG. 5. FIG. 5 schematically depicts a structure 400 similar to the structure as shown in FIG. 4, the structure including a first pattern (or grating) 410 (the pattern extending in the Y-direction) mounted to a top surface of the structure, and a second pattern (or grating) 420 (the pattern extending in the X-direction) mounted to a bottom surface of the structure. FIG. 5 further shows a radiation beam 440 originating from a sensor (not shown) directed towards the bottom surface of the structure. Upon incidence, the beam reflects on the grating 420, the reflection being depicted by the reflection beams 450 and 460 which e.g. may be the +1 and −1 order of the radiation beam 440. As the lines of the grating 420 extend in the Y-direction, the +1 and −1 order reflect in a plane perpendicular to the Y-direction, i.e. the XZ-plane. The reflected beams 450 and 460 may further be captured by detector elements (not shown) of the sensor co-operating with the grating. The non-reflected part of the radiation beam 440 propagates through the structure and incidents the grating 410. Similar to the incident with the grating 420, the radiation beam is reflected and a +1 and a −1 order of the reflected beam (470, 480) are captured by detector elements. As the lines of the grating 410 extend in the X-direction, the reflected beams may be found in a plane perpendicular to the X-direction, the YZ-plane. Such an arrangement may e.g. be applied in order to determine a first and second position quantity of an object. As an example, such an arrangement may e.g. be applied in a lithographic apparatus for determining the X- and Y-position of a substrate table provided with a substrate. As such, the structure including the gratings may e.g. be mounted to a reference frame or reference part (e.g. a projection lens) of the lithographic apparatus, whereas the co-operating sensor is mounted to the substrate table or to a positioning device that controls and positions the substrate table.

Figure 6:
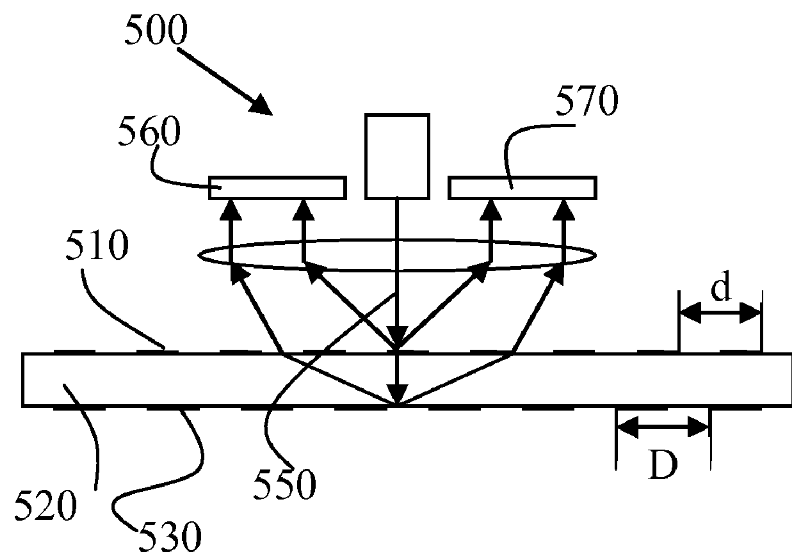
FIG. 6 schematically depicts a 2D view of a position measurement system according to an embodiment of the present invention.
Figure 7:
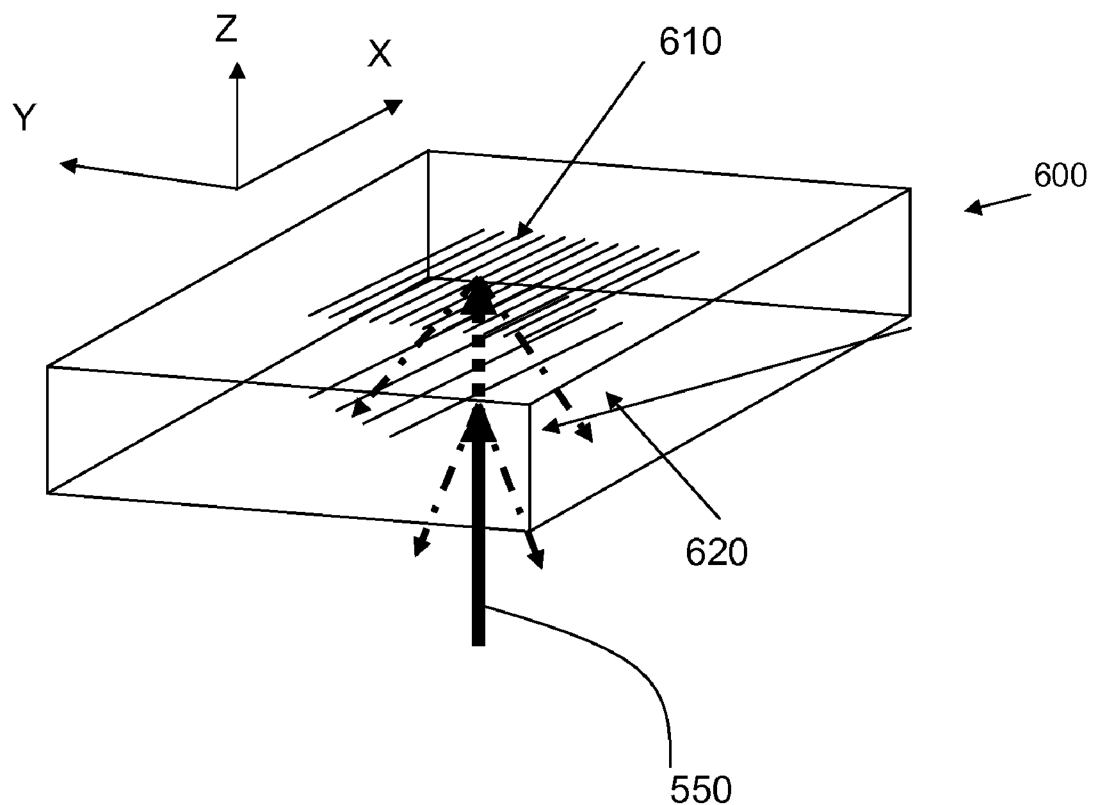
FIG. 7 schematically depicts a 3D view of a position measurement system according to an embodiment of the invention.

Embodiments of the present invention are not limited to embodiments wherein the first and second position quantities relate to information with respect to different directions. To illustrate this, FIG. 6 schematically depicts an XZ-view of an embodiment of the present invention including a sensor 500 arranged to co-operate with a first grating 510 mounted to a structure 520 and with a second grating 530 mounted to a different surface of the structure. Both gratings extend in the X-directions and include a plurality of lines extending in the Y-direction (perpendicular to the XZ-plane). As can be seen, the two gratings 510 and 530 differ in that they have a different pitch (indicated by 'd' and 'D' in FIG. 6. FIG. 6 further shows the incident beam 550 origination from the sensor 500 and the reflected beams from the surface including the first grating and the surface including the second grating, towards detector elements 560 and 570 of the sensor. It can be shown that the arrangement as depicted allows for an absolute position measurement of the sensor relative to the structure, over a period (in the X-direction) equal to D/(D-d). Within this period, each position is characterized by a unique combination of signals originating from both gratings. FIG. 7 schematically depicts a 3 dimensional (3D) view of such an arrangement. The figure schematically shows a structure 600 including a first grating 610 extending in the X-direction and a second grating 620, also extending in the X-direction, the second grating having a different pitch (indicated by the larger distance between the different lines of the grating). A radiation beam that is incident on the structure may partly reflect on the first grating, and partly propagate through the structure to the second grating. It will be appreciated that in this case, the reflected beams from both gratings may be arranged in a plane perpendicular to the Y-direction, i.e. the direction parallel to the lines of the first and second grating.

In an embodiment of the present invention, the first pattern includes a linear grating enabling an incremental position measurement, whereas the second pattern includes a reference mark. Such a reference mark enables the determination of the absolute position at a certain position; when the reference mark is noticed by the sensor, absolute position information is obtained for the sensor relative to the structure. Once this reference is established, displacement along the direction in which the first grating extends, may provide absolute positional information on the sensor relative to the structure. The presence of such a reference mark (or reference marks) may be applied during initialization of the measurement system e.g. during start-up or after a power surge. This procedure may also be referred to as homing or zeroing.

Figure 8:
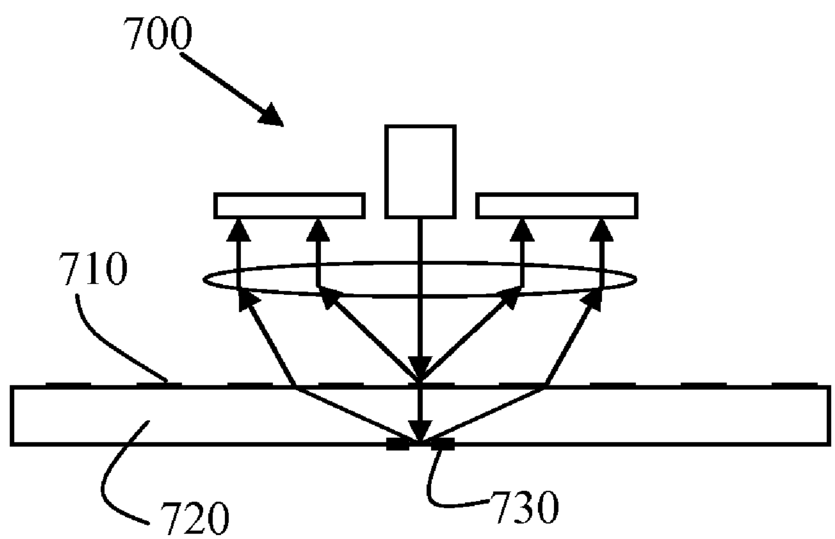
FIG. 8 schematically depicts a 2D view of another position measurement system according to an embodiment of the present invention.

FIG. 8 schematically depicts an XZ-cross-section view on such a system. The measurement system as shown includes a sensor 700 arranged to co-operate with a first grating 710 mounted to a structure 720 and a reference marker 730 mounted to a different surface of the structure. As in the system described in FIG. 6, the reflected beams of an incident radiation beam may be detected by the sensor 700 and enables two position quantities to be determined; in the example as shown, the two position quantities consist of a incremental position measurement and an absolute position detection at a certain position (determined by the position of the reference marker 730)

In an embodiment of the present invention, a pattern mounted to the structure is embedded in the structure, or, phrased different, is mounted to an inner surface of the structure. In order to manufacture a structure as applied in the present invention, one may apply the first and second pattern on two different outer surface of the structure. Alternatively, the structure including the two patterns may be manufactured by joining two structure parts, each including a grating. Joining the two parts may be done in such manner that one of the gratings is actually embedded in the structure (i.e. mounted to an inner surface of the structure) rather than being on an outer surface. Such an embedded pattern may be preferred because it may be less susceptible to contamination and may enable the cleaning the structure more easily (without the risk of damaging the pattern). Such a structure is illustrated in FIG. 9.

Figure 9:
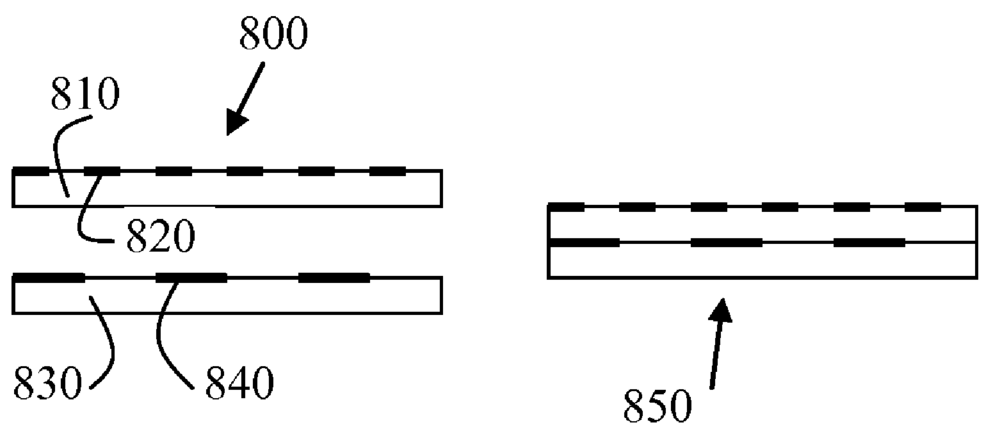
FIG. 9 schematically depicts the assembly of a structure as can be applied in a position measurement system according to an embodiment of the present invention.

FIG. 9 schematically shows a structure 800 in its non-assembled state (left side of the figure) including a first structure part 810 including a first pattern 820 and a second structure part 830 including a second pattern 840. When joined together, the structure as shown on the right of the figure (850) may be obtained, resulting in the second pattern being embedded in the structure.

The gratings or patterns as have been described in the embodiments above, may be either be phase-gratings or a reflective gratings.

It will be appreciated that the radiation beam as referred to in the various embodiments may be, for example, a beam of visible light. More generally however, it will be appreciated that any form of radiation may be applied. As such, the patterns as described herein may have any form or shape. As long as the pattern enables the radiation beam to be affected (i.e. modified in some way), the modified beam may be detected and enables the determination of a position quantity of the sensor relative to the structure.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms “wafer” or “die” herein may be considered as synonymous with the more general terms “substrate” or “target portion”, respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms “radiation” and “beam” used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term “lens”, where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A position measurement system comprising a sensor arranged to co-operate with 1) a first pattern arranged on a structure to determine a first position quantity of the sensor relative to the structure, and 2) a second pattern arranged on the structure to determine a second position quantity of the sensor relative to the structure, wherein the first and second patterns are arranged on different surfaces of the structure.

2. The position measurement system according to claim 1, wherein the first pattern is a linear grating extending in a first direction.

3. The position measurement system according to claim 2, wherein the second pattern is a linear grating extending in a second direction substantially perpendicular to the first direction.

4. The position measurement system according to claim 1, wherein the first pattern is a linear grating with a first pitch and the second pattern is a linear grating with a second pitch, different from the first pitch.

5. The position measurement system according to claim 1, wherein the sensor is arranged to project a radiation beam towards the first pattern and, at least partly, through the structure towards the second pattern.

6. The position measurement system according to claim 1, wherein the structure comprises a transparent layer.

7. The position measurement system according to claim 1, wherein the sensor is further arranged to receive a +1 and −1 reflected wave-form of the first pattern.

8. The position measurement system according to claim 7, wherein the sensor is further arranged to receive a +1 and −1 reflected wave-form of the second pattern.

9. The position measurement system according to claim 1, wherein the first and second pattern are arranged on opposite surfaces of the structure.

10. The position measurement system according to claim 1, wherein at least one of the patterns is provided on an inner surface of the structure.

11. The position measurement system according to claim 1, wherein the first position quantity is a measurement of a first displacement of the sensor relative to the structure and the second position quantity is indicative of a measurement of a second displacement of the sensor relative to the structure.

12. The position measurement system according to claim 11, wherein the first and second displacements are along two different directions.

13. The position measurement system according to claim 1, wherein the first and the second position quantity are used by the sensor to determine an absolute position of the sensor relative to the structure.

14. The position measurement system according to claim 1, wherein the sensor is moveable to determine the first and the second position quantity.

15. A lithographic apparatus comprising:

a patterning device support constructed to support a patterning device, the patterning device being capable of imparting a radiation beam with a pattern in its cross-section to form a patterned radiation beam;

a substrate support constructed to hold a substrate;

a projection system configured to project the patterned radiation beam onto a target portion of the substrate; and a position measurement system configured to measure a first and a second position quantity of one of the supports, the measurement system comprising a sensor arranged to co-operate with 1) a first pattern arranged on a structure of the measurement system to determine a relative position between the sensor and the first pattern to determine the first position quantity of the support, and 2) a second pattern arranged on the structure to determine a relative position between the sensor and the second pattern to determine the second position quantity of the support, wherein the first and second pattern are arranged on different surfaces of the structure.

16. The lithographic apparatus according to claim 15, wherein the first position quantity is a displacement in a first direction and the second position quantity is a displacement in a second direction, the first and second directions being substantially perpendicular and parallel to a horizontal plane.

17. The lithographic apparatus according to claim 15, wherein the support is the patterning device support.

18. The lithographic apparatus according to claim 15, wherein the support is the substrate support.

19. A position measurement system comprising:

a sensor arranged on a moveable object, the sensor configured to co-operate with 1) a first pattern arranged on a fixed structure to determine a first quantity of displacement of the object relative to the structure, and 2) a second pattern arranged on the fixed structure to determine a second quantity of displacement of the object relative to the structure, wherein the first and second patterns are arranged on different surfaces of the structure.

20. The position measurement system according to claim 19, wherein the moveable object is a substrate table or a patterning device support of a lithographic apparatus.

21. The position measurement system according to claim 19, wherein the first and the second quantity of displacement are measured along two different directions.

22. The position measurement system according to claim 19, wherein the first and the second quantity of displacement are used by the sensor to determine an absolute position of the object relative to the structure.

* * * * *